United States Patent
Bolton

(10) Patent No.: US 8,248,167 B2
(45) Date of Patent: Aug. 21, 2012

(54) VCO FREQUENCY TEMPERATURE COMPENSATION SYSTEM FOR PLLS

(75) Inventor: Eric K. Bolton, Kernersville, NC (US)

(73) Assignees: MStar Semiconductor, Inc., Hsinchu Hsien (TW); MStar France SAS, Issy les Moulineaux (FR); MStar Software R&D (Shenzhen) Ltd., Shenzhen (CN); MStar Semiconductor, Inc. (Cayman Islands), Grand Cayman (KY)

( * ) Notice: Subject to any disclaimer, the term of this patent is extended or adjusted under 35 U.S.C. 154(b) by 117 days.

(21) Appl. No.: 12/824,982

(22) Filed: Jun. 28, 2010

(65) Prior Publication Data

US 2011/0316595 A1    Dec. 29, 2011

(51) Int. Cl.
*H03L 7/00* (2006.01)

(52) U.S. Cl. ............... 331/16; 331/1 R; 331/17; 331/23; 331/34; 331/117 R; 331/175; 331/176; 375/376

(58) Field of Classification Search .................. 331/1 R, 331/16, 17, 23, 34, 117 R, 175, 176; 375/376
See application file for complete search history.

(56) References Cited

U.S. PATENT DOCUMENTS

| | | | |
|---|---|---|---|
| 4,918,404 A * | 4/1990 | Vitiello et al. ................... | 331/11 |
| 4,978,930 A | 12/1990 | Suter | |
| 5,831,482 A | 11/1998 | Salvi et al. | |
| 6,342,798 B1 | 1/2002 | Yoshida | |
| 6,545,547 B2 | 4/2003 | Fridi et al. | |
| 6,946,915 B2 * | 9/2005 | Zhang .......................... | 331/1 A |
| 7,026,879 B2 * | 4/2006 | Booth ............................. | 331/17 |
| 7,164,325 B2 | 1/2007 | Aparin et al. | |
| 7,336,134 B1 * | 2/2008 | Janesch et al. .............. | 331/36 C |
| 7,965,144 B2 * | 6/2011 | Miura et al. ..................... | 331/44 |
| 7,982,551 B2 * | 7/2011 | Iwaida et al. ................. | 331/176 |
| 8,013,682 B2 * | 9/2011 | Hu et al. .......................... | 331/16 |
| 2007/0013449 A1 * | 1/2007 | Ishii et al. ....................... | 331/16 |

* cited by examiner

*Primary Examiner* — Arnold Kinkead
*Assistant Examiner* — Richard Tan
(74) *Attorney, Agent, or Firm* — WPAT., P.C.; Justin King

(57) ABSTRACT

The present invention discloses a continuous voltage controlled oscillator (VCO) frequency temperature compensation apparatus for a phase locked loop (PLL) and a continuous VCO frequency temperature compensation method for a PLL. The system utilizes a VCO with one digital coarse tuning input, a first analog fine tuning input, and a second analog fine tuning input. The system uses the second analog fine tuning inputs to compensate the VCO for frequency shifts due to temperature fluctuation. When the PLL transitions to the fine lock (FL) mode, the system starts driving the second fine tuning input with a differential amplifier. The differential amplifier compares the first fine tuning input with a reference voltage, and drives the second fine tuning input to compensate the first fine tuning input.

20 Claims, 8 Drawing Sheets

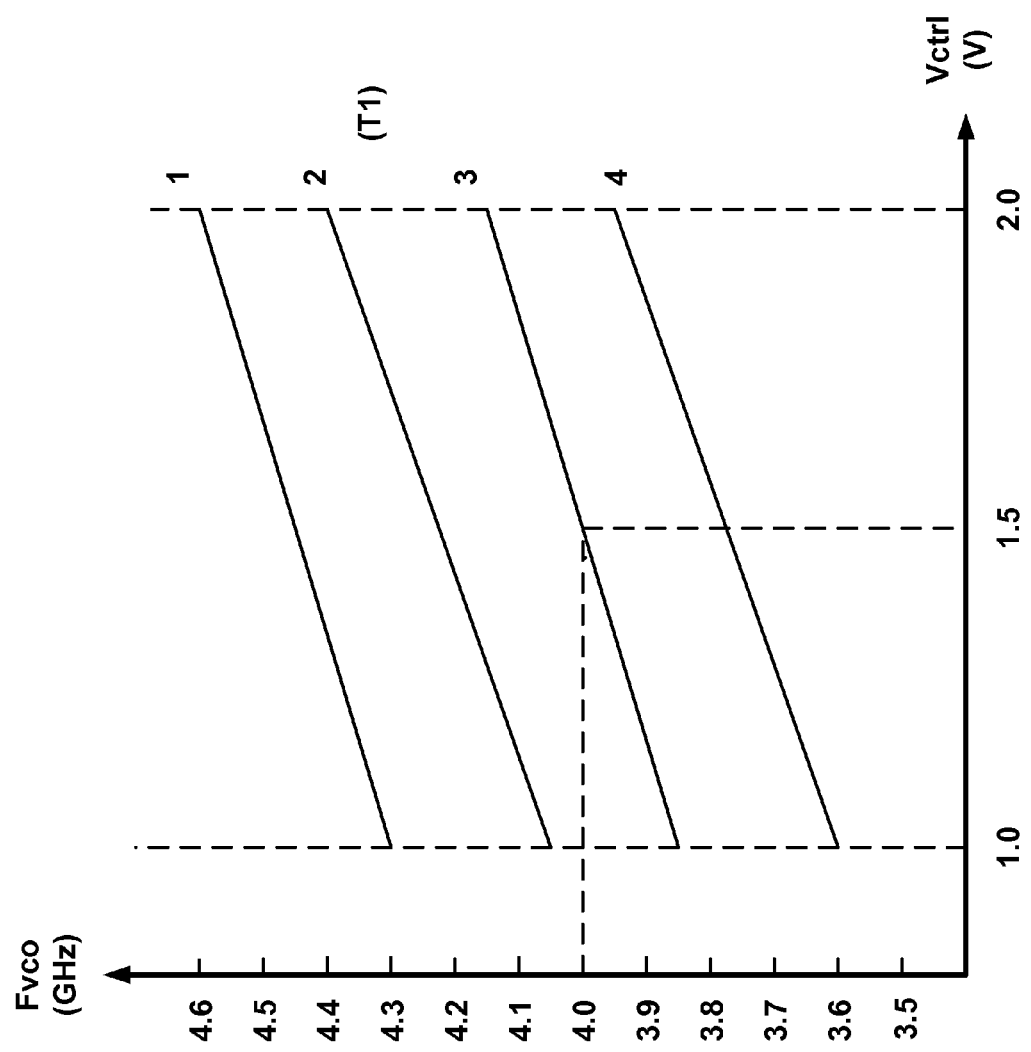

VCO FREQUENCY TEMPERATURE COMPENSATION SYSTEM FOR PLLS

FIELD OF THE INVENTION

This invention relates to a continuous voltage controlled oscillator (VCO) frequency temperature compensation system for phase lock loops (PLL), and more particularly this invention allows a PLL to remain fine locked during a large temperature transient, which would normally shift the VCO free-running frequency outside of the track-able tuning range of the PLL.

BACKGROUND OF THE INVENTION

Referring to FIG. 1 showing a PLL, the PLL comprises a phase frequency detector 10, a charge pump 20, a loop filter 30, a VCO 40 and a frequency divider 45. A reference signal with a reference frequency $F_{ref}$ is generated by a reference oscillator (not shown), and is inputted simultaneously into the phase frequency detector 10 along with a frequency divided signal from the frequency divider 45. The phase frequency detector 10 detects a phase and frequency difference between the reference signal and the frequency divided signal, and it then outputs a phase difference signal to the charge pump 20. The charge pump 20 then generates an output current having a value associated with the phase difference signal and fed to the loop filter 30, resulting in an output signal having an amplitude corresponding to the phase difference signal. The loop filter 30 smoothes the output current and converts it to a control voltage $V_{ctrl}$ fed to the VCO 40. The VCO 40, according to the control voltage $V_{ctrl}$, generates a voltage controlled signal having a voltage controlled frequency $F_{vco}$, which is then divided using the frequency divider 45 by N to generate the frequency divided signal upon receiving the voltage controlled signal, where N may or may not be an integer and $F_{vco} = N * F_{ref}$.

The VCO 40 typically has two types, an LC oscillator and a ring oscillator. To enable the VCO 40 to operate with a higher adjustable frequency range, the VCO includes a bank of switched capacitors. The switched capacitor bank or capacitor DAC is controlled with a digital control word to shift the VCO frequency so that the VCO 40 can provide a plurality of frequency tuning curves for adjusting the voltage controlled frequency $F_{vco}$ of the voltage controlled oscillator. FIG. 2 showing a relationship diagram of a control voltage $V_{ctrl}$ and a voltage controlled frequency $F_{vco}$ of a conventional VCO.

With reference to FIG. 2, the control voltage $V_{ctrl}$ of the voltage controlled signal has a linear control range, i.e., the range between $V_L$ and $V_H$. When the VCO operates on curve 1, the voltage controlled frequency $F_{vco}$ of the VCO varies between the range of $F_{1L}$ and $F_{1H}$. When the VCO operates on curve 2, the voltage controlled frequency $F_{vco}$ of the VCO varies between the range of $F_{2L}$ and $F_{2H}$. When the VCO operates on curve 3, the voltage controlled frequency $F_{vco}$ of the VCO varies between the range of $F_{3L}$ and $F_{3H}$. When the VCO operates on curve 4, the voltage controlled frequency $F_{vco}$ of the VCO varies between the range of $F_{4L}$ and $F_{4H}$. More specifically, the voltage controlled frequency $F_{vco}$ of the VCO in FIG. 2 may cover a range from $F_{1H}$ to $F_{NL}$, where N is the number of digitally controlled switched capacitors in the circuit. Therefore, it is concluded that the variable range of the voltage controlled frequency $F_{vco}$ increases as the number of curves provided by the VCO increases.

In order to maintain a stable voltage controlled frequency $F_{vco}$ when operating the PLL in an environment where the ambient temperature varies over a relatively large range, the control voltage $V_{ctrl}$ also needs to vary with the temperature variance. For example, FIGS. 3A and 3B are schematic diagrams of the control voltage $V_{ctrl}$ and the voltage controlled frequency $F_{vco}$ when a VCO of a same PLL operates under different temperatures T1 and T2. Suppose the VCO selects curve 3 as its operating band, $V_L = 1V$ and $V_H = 2V$, and the voltage controlled frequency $F_{vco}$ is fixed at 4 GHz, and T1<T2. FIG. 3A shows the relationship diagram at the temperature T1, when the control voltage $V_{ctrl}$ is at 1.5V, the voltage controlled frequency $F_{vco}$ of the VCO may operate at 4 GHz. Note that, accompanied with increase in temperature, all bands of the VCO shifts downwards. Hence, as shown in FIG. 3B, to maintain the VCO frequency at the new temperature, T2 the locked PLL automatically adjusts the control voltage $V_{ctrl}$ to 1.9V. If the temperature continues to rise to a higher temperature, the control voltage $V_{ctrl}$ shall also adaptively increase until it reaches the maximum range of the voltage controlled capacitance (2V in this example). Once the control voltage $V_{ctrl}$ exceeds the linear control range, it causes the PLL to lose lock.

As described above most PLLs with an LC VCO require two tuning inputs. There is a digital coarse tuning input that drives a bank of switchable capacitors; and there is an analog fine tuning input that drives a varactor. During coarse tuning (CT), the analog fine tuning input is held constant by a voltage digital analog converter (DAC) and the PLL is locked using only the digital coarse tuning VCO input. The turning algorithm eventually converges to the most likely coarse tuning curve and the PLL is considered coarse locked. The PLL then enters fine lock (FL) mode. During this mode, the PLL CT inputs are held at the converged upon value from the previous state and the analog fine tuning input is driven by the PLL loop filter rather than the voltage DAC. In this mode, the PLL will remain locked as long as the fine tuning range of the VCO is not exceeded. The PLL will also track any VCO frequency transient as long as it is within the bandwidth of the PLL.

If a temperature transient causes the VCO frequency to decrease, the PLL will have to push the analog fine tuning voltage higher to keep the PLL locked at the same frequency. Certain electronic communications, such as the wideband code-division multiple access (WCDMA TX/RX), require that the PLLs lock and potentially remain locked for a very long time period without any allowable interruption. Thus, it is the objective of the current invention to provide a system that allows the PLLs to remain fine locked during the large temperature transient or any other outside influences.

The U.S. Pat. No. 4,978,930 issued to Suter discloses a low voltage VCO temperature compensation circuit. Suter discloses a varactor VCO circuit, and Suter's varactor VCO circuit calculates an offset value between a PTAT current and a temperature stable current, and provides the offset value to control the VCO varactor. Suter's invention assumes that the entire temperature variation of the VCO must be supported by the varactor turning range.

The U.S. Pat. No. 5,831,482 issued to Salvi discloses a method and apparatus for self-tuning a VCO. Salvi discloses a VCO with two analog inputs. Salvi discloses a coarse tuning employing a comparator comparing the VCO control voltage to a reference voltage. Salvi's comparator outputs the result into a 4-bit register that drives a DAC. The DAC drives a loop filter that drives a second analog tuning voltage input. Salvi discloses that the circuit only operates for a predetermined number of clock cycles. Salvi's circuit does not operate after the initial tuning and Salvi does not disclose a continuous monitoring and compensating the tuning signal.

The U.S. Pat. No. 6,342,798 issued to Yoshida discloses a PLL circuit with a temperature compensated VCO. Yoshida discloses an open loop temperature compensating circuit. Yoshida discloses an external control voltage to the VCO as an input in range of the phase comparator. With this external control voltage, Yoshida provides a stable PLL operation regardless the change of the ambient temperature. Yoshida does not disclose any feedback loop connecting to the temperature variable voltage source.

The U.S. Pat. No. 7,164,325 issued to Aparin discloses a temperature stabilized voltage controlled oscillator similar to Yoshida patent above. Aparin discloses compensating temperature change by applying a temperature variable voltage source, such as a proportional to absolute temperature (PTAT) device, to varactors of the VCO resonant circuit. Aparin does not disclose any feedback loop connecting to the temperature variable voltage source.

The U.S. Pat. No. 6,545,547 issued to Fridi discloses holding the main varactor at a set voltage during the coarse tuning. Fridi discloses hybrid digital coarse VCO turning and VCO temperature drift compensation providing for a fully digital tuning scheme without the need for charge pumps. Fridi discloses setting and correcting a digital VCO coarse tuning code by comparing an N divider output to a fixed timer clock. The N divider content is used to set the next VCO coarse turning code. Fridi divides the coarse tuning process into two phases: an open loop phase and a closed loop phase. Once a new channel is selected by a device using the PLL, a control signal will open the loop via a first switch and set the VCO analog control line to a reference voltage through a second switch. Fridi assumes that the entire temperature variation of the VCO is accounted for in the main varactor range, and Fridi does not discloses any continuous monitoring and compensating after the coarse tuning.

In view the conventional practices, there is a need to continuous monitoring the VCO frequency and to compensate the VCO control voltage independently from the PLL based on the monitoring result; hence, the PLL can remain fine locked. The current invention provides a novel design to allow a PLL to remain fine locked during a large temperature transient. Furthermore, the current invention provides a system and a method selectively to compensate the temperature change or to tune the VCO based on a bandgap referenced voltage.

SUMMARY OF THE INVENTION

The present invention discloses a continuous voltage controlled oscillator (VCO) frequency temperature compensation apparatus for a phase locked loop (PLL) and a continuous VCO frequency temperature compensation method for a PLL. It is an objective of the current invention to provide a continuous monitoring and compensation to the main analog fine tuning input, so that the PLL can avoid changing the voltage of the main fine tuning input and remains fine locked when being operated in an environment where ambient operating temperature or any other environmental factors vary with a large range.

The system utilizes a VCO with one digital coarse tuning input, a first analog fine tuning input, and a second analog fine tuning input. The system uses the second analog fine tuning inputs to compensate the VCO for frequency shifts due to temperature fluctuation. When the PLL transitions to the fine lock (FL) mode, the system starts driving the second fine tuning input with a differential amplifier. The differential amplifier compares the first fine tuning input with a reference voltage, and drives the second fine tuning input to compensate the first fine tuning input.

According to a first aspect of the present invention, a method for locking a phase lock loop (PLL) frequency by continuously compensating a voltage controlled oscillator (VCO) control voltage is disclosed; the method comprises providing a VCO with a first analog tuning input port and a second analog tuning input port, providing a first digital-analog converter (DAC) coupled to the first analog tuning input port via a first switch, generating a first control signal by the first DAC, providing the first control signal to the first analog tuning input port, providing a preload voltage generator circuit coupled to the second analog tuning input port via a second switch, generating a second control signal from selecting a coarse band by the preload voltage generator circuit based on a selected channel frequency, providing the second control signal to the second analog tuning input port, providing a differential switch coupled to the second analog tuning input port via a third switch, providing a processing circuit coupled to the first tuning input port via a fourth switch, and further coupled to the differential amplifier, generating said VCO control voltage from comparing a VCO output signal to a first reference signal by the processing circuit, providing said VCO control voltage to the first analog tuning input port, generating a third control signal from comparing said VCO control voltage to a second reference signal by the differential amplifier, and providing the third control signal to the second analog tuning input port.

According to another aspect of the present invention, the method further comprises providing the first control signal to the first tuning input port by closing the first switch during a coarse tuning (CT) time frame, providing the second control signal to the second analog tuning input port by closing said second switch during said CT time frame, prohibiting the third control signal from the second analog tuning input port by opening the third switch during said CT time frame, prohibiting the VCO control voltage from the first analog tuning input port by opening the fourth switch during the CT time frame, prohibiting the first control signal from the first analog tuning input port by opening the first switch during a fine lock (FL) time frame, prohibiting the second control signal from the second analog tuning input port by opening the second switch during the FL time frame, providing the third control signal to the second analog tuning input port by closing the third switch during the FL time frame; providing the VCO control voltage to the first analog tuning input port by closing the fourth switch during the FL time frame, and the FL time frame is after the CT time frame.

According to another aspect of the present invention, the method can further comprises providing the first control signal to the first analog tuning input port by closing the first switch during the CT time frame, providing the second control signal to the second analog tuning input port by closing the second switch during the CT time frame, prohibiting the third control signal from the second analog tuning input port by opening the third switch during the CT time frame, prohibiting the VCO control voltage from the first analog tuning input port by opening the fourth switch during the CT time frame, prohibiting the first control signal from the first analog tuning input port by opening the first switch during the FL time frame, providing the second control signal to the second analog tuning input port by closing the second switch during the FL time frame, prohibiting the third control signal from the second analog tuning input port by opening the third switch during the FL time frame, providing the VCO control voltage to the first analog tuning input port by closing the fourth switch during the FL time frame, and the FL time frame is after the CT time frame.

According to another aspect of the present invention, the method further comprises providing for reducing required frequency range by preloading the second analog tuning input port by the preload voltage generator circuit. The VCO can be either a ring VCO or a LC VCO. The processing circuit can include either a loop filter or a digital-analog converter. The preload voltage generator circuit can be a voltage proportional-to-absolute-temperature (VPTAT) preload voltage generator circuit or a voltage bandgap (VBG) preload voltage generator circuit. The differential amplifier comprises a positive input port and a negative input port, and the positive input port receives the VCO control voltage, and the negative input port receives a first reference signal. The method can further comprise setting the second reference to be equal to the first control signal or to a programmable bandgap voltage reference. The method can further comprise providing a bandgap voltage by a bandgap circuit to the VBG preload voltage generator circuit and setting the second reference to be equal to the bandgap voltage.

According to another aspect of the present invention, a continuous VCO compensation system for locking a PLL frequency by continuously compensating a VCO control voltage is disclosed; the system comprises a VCO with an first analog tuning input port and a second analog tuning input port, a first digital-analog converter (DAC), coupled to the first analog tuning port via a first switch, for providing a first control signal to the first analog tuning port, a preload voltage generator circuit, coupled to the second analog tuning port via a second switch, for generating a second control signal from selecting a coarse band based on a selected channel frequency and for providing the second control signal to the second analog tuning port, a differential amplifier, coupled to the second analog tuning port via a third switch, for generating a third control signal; and a processing circuit, coupled to the first analog tuning port via a fourth switch, and further coupled to the differential amplifier, for generating the VCO control voltage by comparing a VCO output signal to a first reference signal, and providing the VCO control voltage to the differential amplifier and the VCO, the differential amplifier generates the third control signal by comparing a VCO control voltage to a second reference, and compensates the VCO control voltage by providing the third control signal to the second analog tuning port.

According to another aspect of the present invention, in the system of the present invention, the first switch is closed to provide the first control signal to the first analog tuning input port during a coarse tuning (CT) time frame, the second switch is closed to provide the second control signal to the second analog tuning input port during the CT time frame, the third switch is opened to prohibit the third control signal from the second analog tuning input port during the CT time frame, the fourth switch is opened to prohibit the VCO control voltage from the first analog tuning input port during the CT time frame, the first switch is opened to prohibit the first control signal from the first analog tuning input port during a fine lock (FL) time frame, the second switch is opened to prohibit the second control signal from the second analog tuning input port during the FL time frame, the third switch is closed to provide the third control signal to the second analog tuning input port during the FL time frame, the fourth switch is closed to provide the VCO control voltage to the first analog tuning input port during the FL time frame; and the FL time frame is after the CT time frame.

According to another aspect of the present invention, in the system of the present invention, the first switch is closed to provide the first control signal to the first analog tuning input port during the CT time frame, the second switch is closed to provide the second control signal to the second analog tuning input port during the CT time frame, the third switch is opened to prohibit the third control signal from the second analog tuning input port during the CT time frame, the fourth switch is opened to prohibit the VCO control voltage from the first analog tuning input port during the CT time frame, the first switch is opened to prohibit the first control signal from the first analog tuning input port during the FL time frame, the second switch is closed to provide the second control signal to the second analog tuning input port during the FL time frame, the third switch is opened to prohibit the third control signal from the second analog tuning input port during the FL time frame; the fourth switch is closed to provide the VCO control voltage to the first analog tuning input port during the FL time frame, and the FL time frame is after the CT time frame.

According to another aspect of the present invention, in the system of the present invention, the preload voltage generator circuit can preload the second analog tuning input port to minimize the required frequency range. The VCO can be either a ring VCO or a LC VCO. The preload voltage generator circuit can be a voltage proportional-to-absolute-temperature (VPTAT) preload voltage generator circuit or a voltage bandgap (VBG) preload voltage generator circuit. The second reference can be either the first control signal or a programmable bandgap voltage reference. The processing circuit includes a loop filter or a second digital-analog converter. The differential amplifier comprises a positive input port and a negative input port, the positive input port receives the VCO control voltage, and the negative input port receives the first reference signal. The system of the present invention can further comprise a bandgap circuit, coupled to the VBG preload voltage generator circuit, for providing a bandgap voltage to the VBG preload voltage generator circuit, and the second reference is set to be equal to the bandgap voltage.

BRIEF DESCRIPTION OF THE DRAWINGS

The present invention will become more readily apparent to those ordinarily skilled in the art after reviewing the following detailed description and accompanying drawings, in which:

FIGS. 3A and 3B are schematic diagrams of the control voltage $V_{ctrl}$ and the voltage controlled frequency $F_{vco}$ when a VCO of a same PLL operates under different temperatures T1 and T2.

DETAILED DESCRIPTION OF THE PREFERRED EMBODIMENT

The invention utilizes a three input VCO with a second fine tuning analog input used to compensate the VCO for frequency shifts. During CT mode, this second fine tuning input is driven by a preload voltage reference circuit that holds the input constant at a voltage level that can be a constant programmable value or a value that is proportional to temperature. When the loop transitions to FL mode, the second fine tuning input is driven by a differential amplifier.

Figure 1:
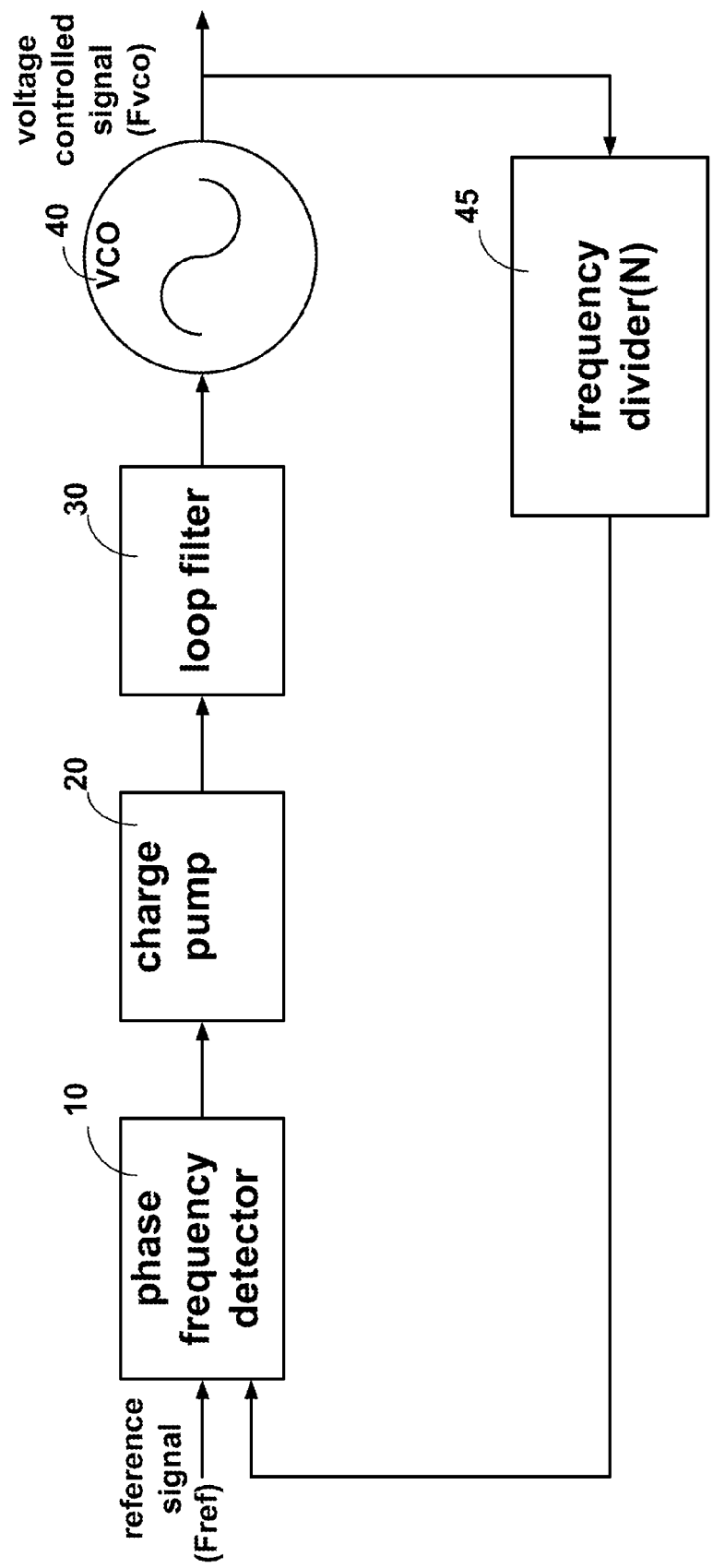
FIG. 1 is a schematic diagram of a phase locked loop (PLL).
Figure 2:
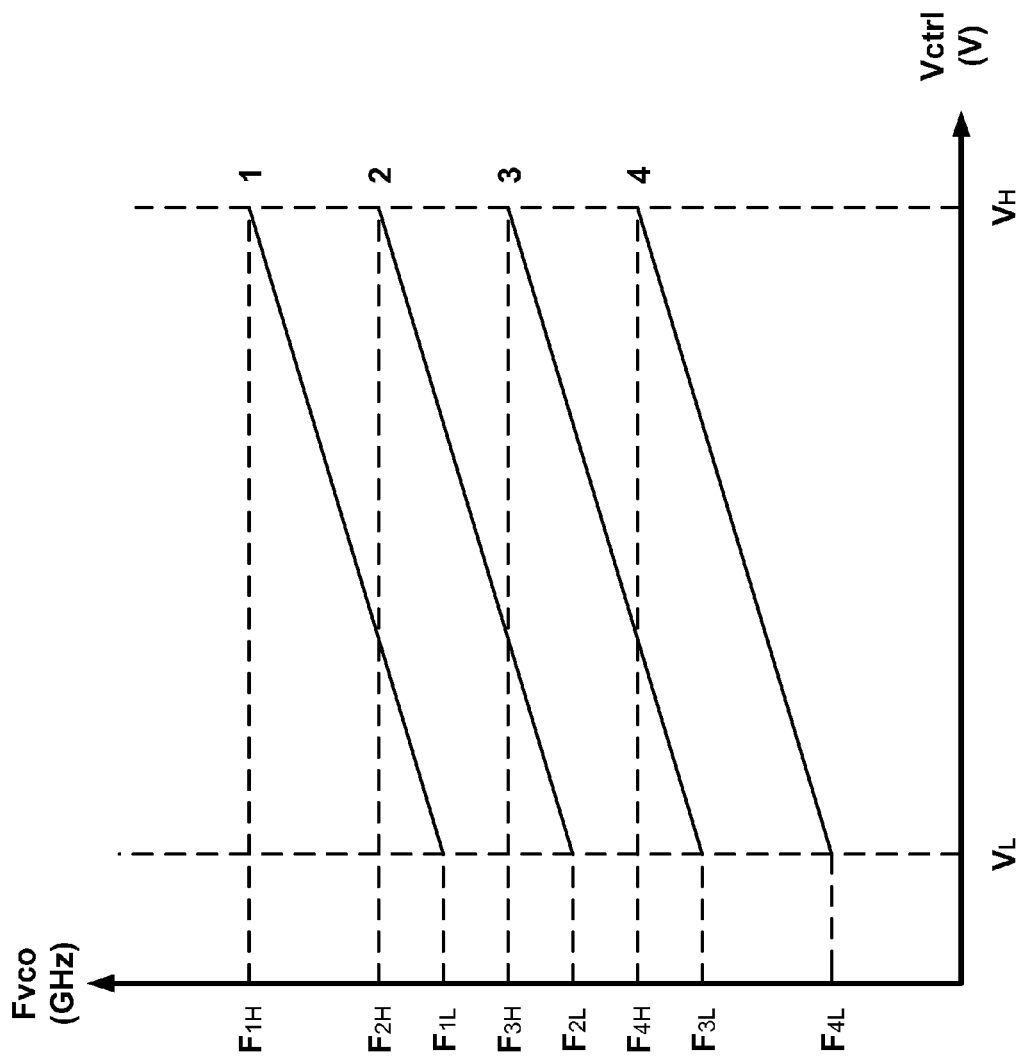
FIG. 2 is a relationship diagram of a control voltage $V_{ctrl}$ and a voltage controlled frequency $F_{vco}$ of a conventional VCO.
Figure 3B:
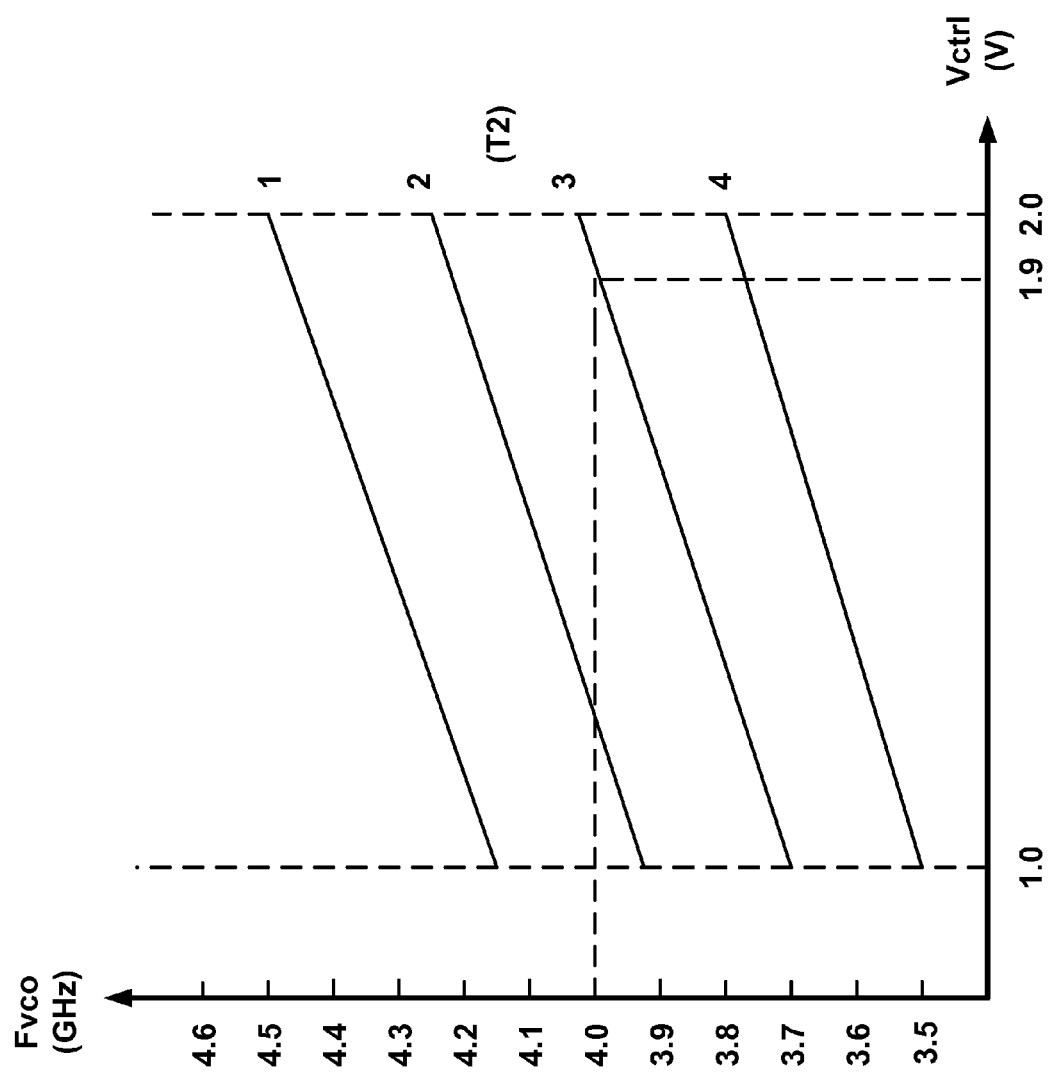
Figure 4:
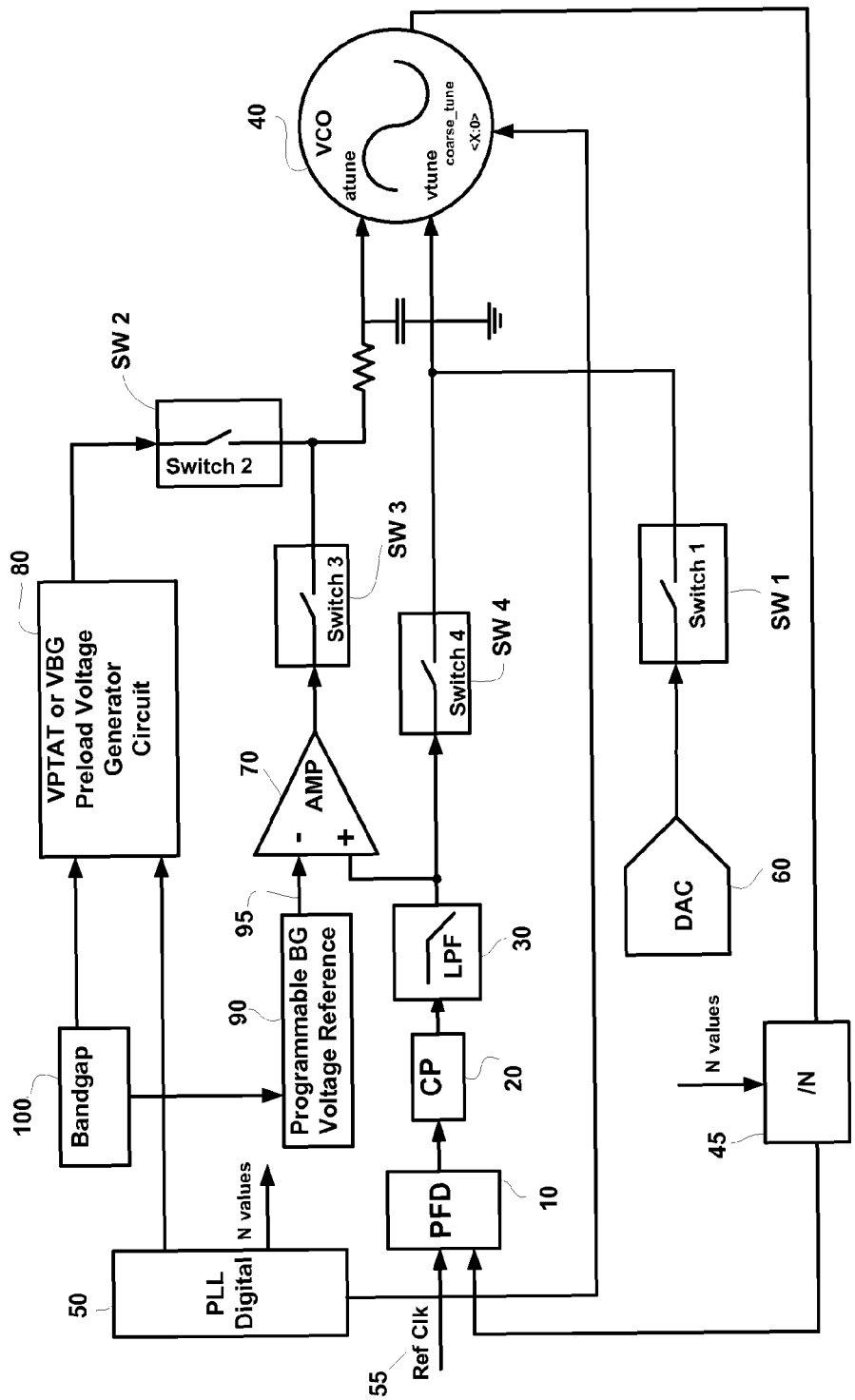
FIG. 4 shows a system according to one preferred embodiment of the invention.
Figure 5:
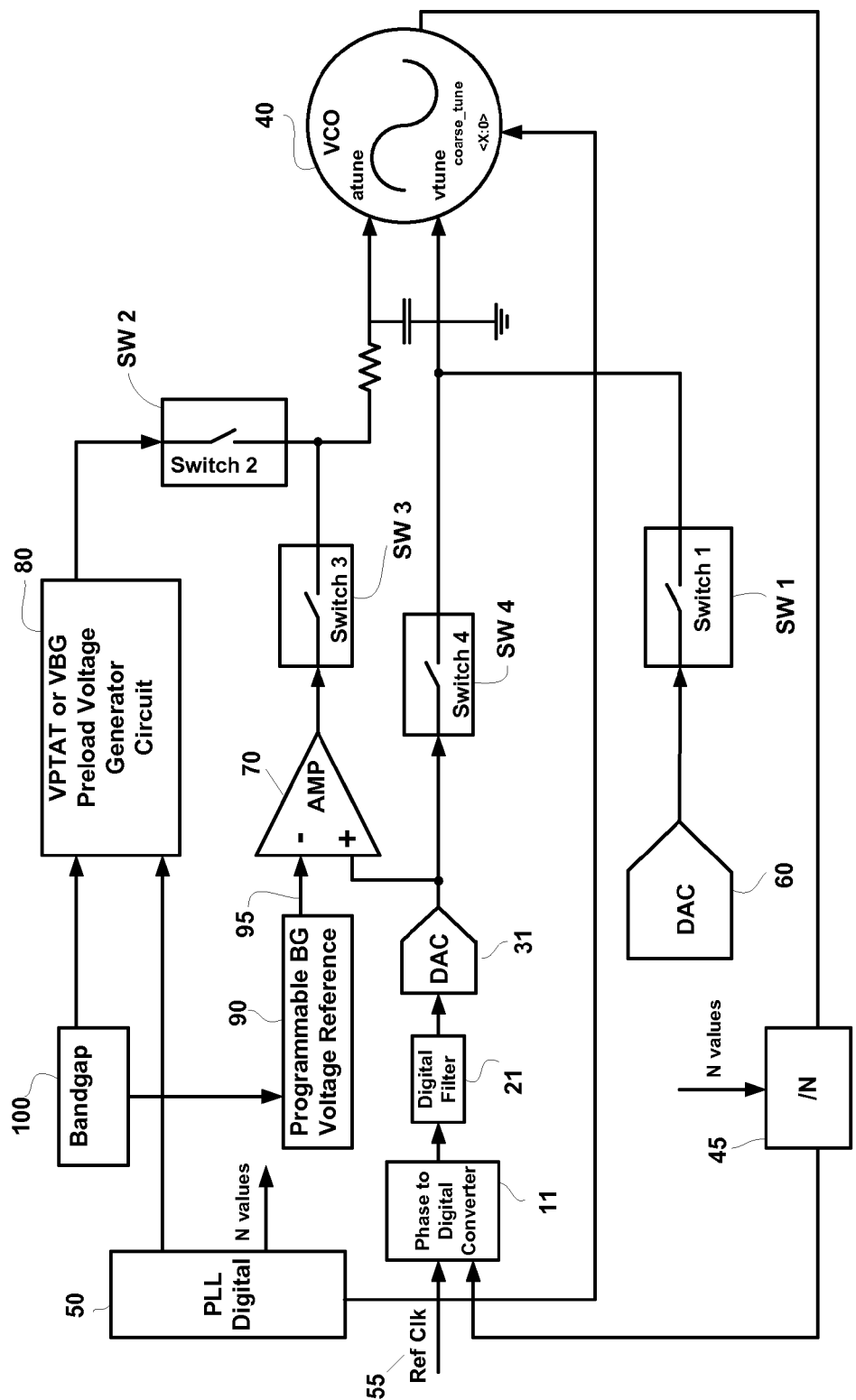
FIG. 5 shows a system according to another preferred embodiment of the invention.

FIG. 4 is a detailed diagram of a system according to the present invention. The system as illustrated in FIG. 4 discloses a PLL 50, a VCO 40, a divider 45, a digital-analog converter 60, a differential amplifier 70, a preload voltage generator circuit 80, a programmable bandgap voltage circuit 90, and a bandgap circuit 100. The system further discloses a processing circuit comprising a phase frequency detector 10, a charge pump 20, and a loop filter 30. The processing circuit generates a VCO control voltage. In an alternative embodiment digital PLL as illustrated in FIG. 5, the processing comprises a phase to digital converter 11, digital filter 21, and a digital-analog converter 31 in lieu of the phase frequency detector 10, the charge pump 20, and the loop filter 30. The preload voltage generator circuit 80 can be implemented with a VPTAT circuit or a voltage bandgap (VBG) circuit.

The VCO 40 includes a first analog tuning input port, i.e., the vtune input port, and a second analog tuning input port, i.e., the atune input port. The atune input port connects to the preload voltage generator circuit 80 and the differential amplifier 70 via the switch SW2 and the switch SW3 respectively. The first analog tuning input port connects to the digital-analog converter 60 and the loop filter 30 via the switch SW1 and the switch SW4 respectively.

The VCO 40 generates a VCO output signal to a divider 45. The divider 45 divides the VCO output signal and provides the divided VCO output signal to the phase frequency detector 10. The phase frequency detector 10 also receives a reference signal 55, and determines the differences between the reference signal 55 and the divided VCO output signal; the detector 10 then outputs the result to the charge pump 20. The charge pump 20 then generates an output current having a value associated with the phase difference signal to the loop filter 30 accordingly. The loop filter 30 smoothes the output current and converts it into the VCO control voltage and forwards the VCO control voltage to the VCO 40 via the switch SW4.

The digital-analog converter 60 generates a first control signal, and forwards the first control signal to the VCO 40 via the switch SW1. The digital-analog converter 60 provides a voltage, the first control signal, which is predetermined for obtaining a linear VCO voltage gain (Kv) for the specific VCO architecture, and for obtaining a good phase noise performance with a relatively low Kv.

The preload voltage generator circuit 80 generates a second control signal, and forwards the second control signals to the VCO 40 via the switch SW2. The preload voltage generator circuit 80 is coupled to a bandgap circuit 100 for receiving a bandgap voltage. The preload voltage generator circuit 80 is also coupled to the PLL 50. The PLL 50 provides a selected channel frequency to the preload voltage generator circuit 80; and the PLL 50 also provides the N value to the divider 45.

The differential amplifier 70 has a positive input port and a negative input port. The positive input port of the differential amplifier 70 is coupled to the loop filter 30 for receiving the VCO control voltage. The negative input port of the differential amplifier 70 is coupled to a programmable bandgap voltage reference circuit 90 for receiving a reference signal 95. The programmable bandgap voltage reference circuit 90 is coupled to the bandgap circuit 100 for receiving the bandgap voltage. The differential amplifier 70 determines the differences between the reference signal 95 and the VCO control voltage and generates an a third control signal, and forwards the third control signal to the VCO's second analog tuning input port via the switch SW3.

Due to the bandwidth and noise constraints, there is a very large capacitor on the second input port that must be charged (preloaded) during the coarse tuning. To reduce the required range of the varactor, this varactor can be preloaded to a voltage that is proportional to temperature. The temperature variability of the VCO is larger at lower frequency where there is more temperature sensitive capacitance in the tank. With this knowledge, the preload voltage generator circuit 80 generates the second control signal having four possible coarse bands between PTAT voltages and temperatures, as illustrated in FIG. 7, depending on which channel frequency the PLL is locking to.

Figure 7:
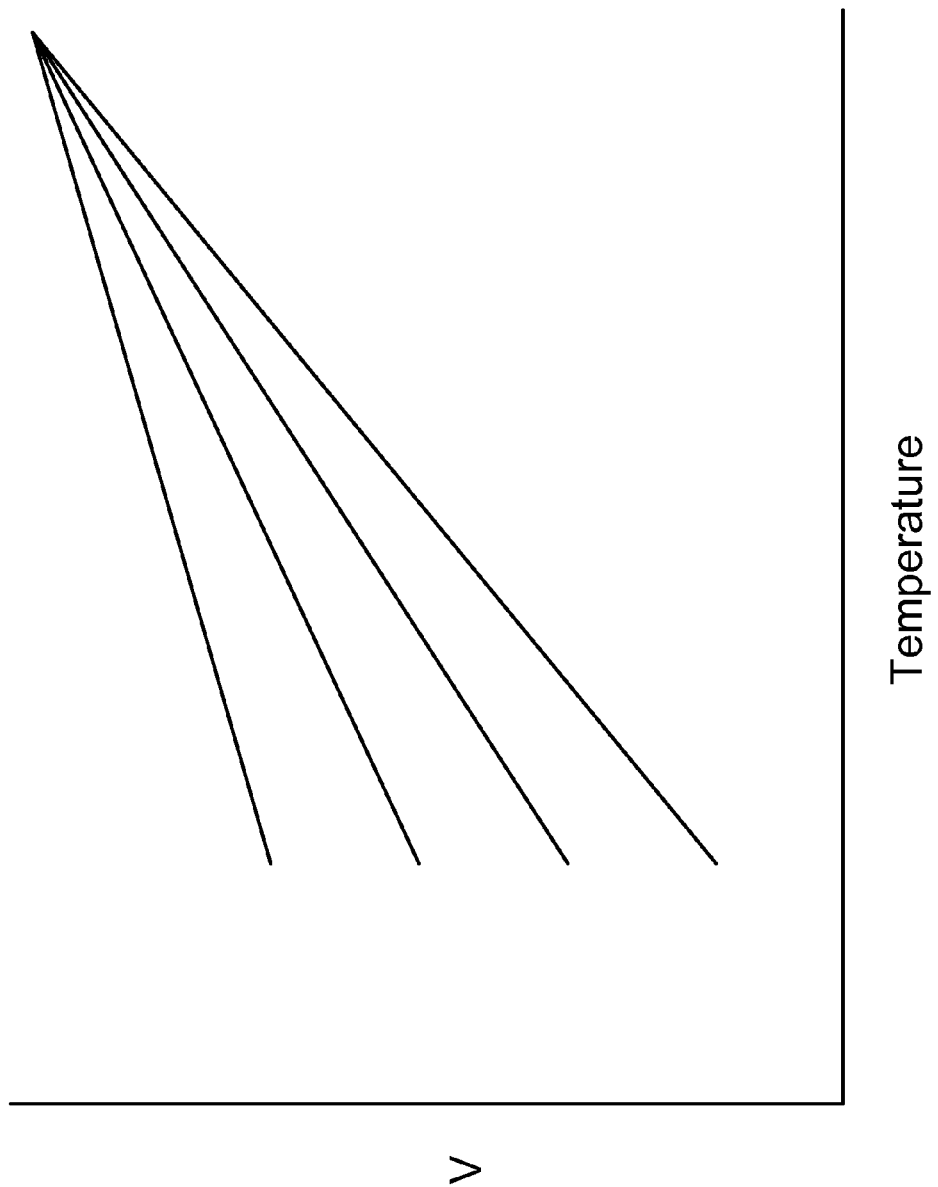
FIG. 7 is a diagram of different voltage proportional-to-absolute-temperature (VPTAT) curves between the temperature and the control voltage $V_{ctrl}$ for the present invention to track the temperature.

Please refer to FIG. 7, which illustrates four possible coarse bands between control voltages and absolute temperature. The vertical scale is the control voltage, and the horizontal scale is the temperature. Each of the four coarse bands has a different slope representing a different gain in each coarse band curve. For example, if the PLL is locked at −40° C. at the lowest frequency, the preload circuit will hold the varactor input at a low voltage during coarse tune and will have the entire range of the second varactor available to speed up the VCO in the event of a temperature increasing up to 125° C. Similarly, if the PLL is locked at a temperature of 125t at the highest frequency, the preload circuit will hold the varactor input at a high voltage with all the available range of the varactor to slow down the VCO in the event of a temperature decreasing down to −40° C. The selection of the course bands depends on the PLL's locked frequency and the temperature at the time of locking. The preload circuit chooses a curve with a larger range when the selected channel frequency has a lower channel frequency; and the preload circuit chooses a curve with a smaller range when the selected channel frequency has a higher channel frequency.

Figure 6:
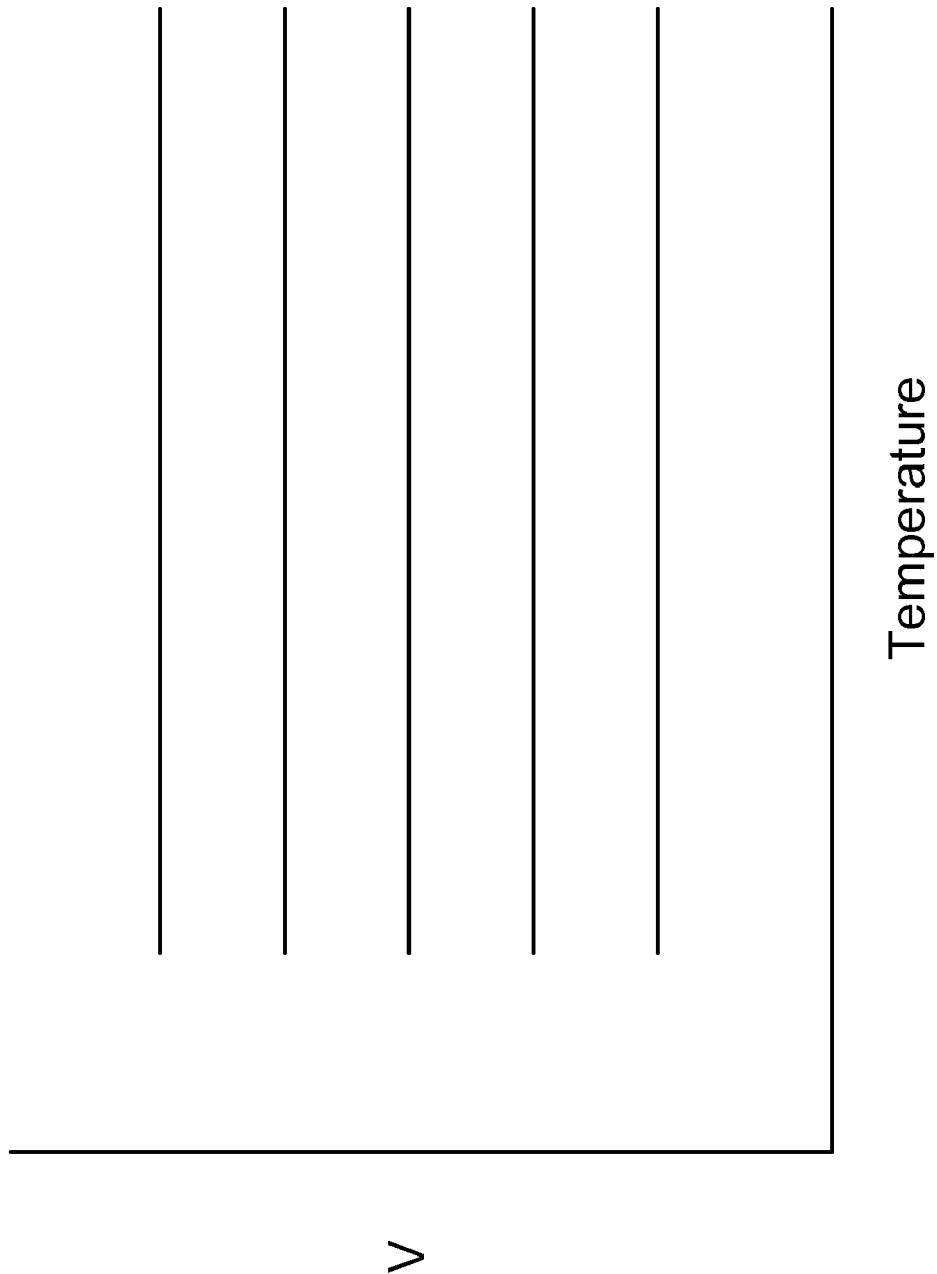
FIG. 6 is a diagram of different voltage independent of absolute-temperature (VITAT) curves between the temperature and the control voltage $V_{ctrl}$ for the present invention to track the temperature.

When the temperature tracking option is not selected, the present invention will drive the varactor to a programmable bandgap referenced constant voltage; the second control signal of the preload voltage generator circuit 80 is then constant with changing temperature as illustrated in FIG. 6. This feature can be used in modes where temperature tracking is not required to skew the tuning range of the VCO.

The present invention provides two phases of tuning: a coarse tuning (CT) and a fine lock (FL). The present invention also provides the PLL the ability to selectively track temperature and compensate temperature fluctuation accordingly.

Under a temperature tracking mode, the present invention, during the CT period, closes the switch SW1 and the switch SW2, and opens the switch SW3 and the switch SW4; during the FL period, the present invention then opens the switch SW1 and the switch SW2, and closes the switch SW3 and the switch SW4. Under a non-temperature tracking mode, the present invention, during the CT period, closes the switch SW1 and the switch SW2, and opens the switch SW3 and the switch SW4; during FL period, the present invention opens the switch SW1 and closes the switch SW4, and maintains the switch SW2 and the switch SW3 unchanged from their previous state. The details of the operations under either the temperature tracking mode or the non-temperature tracking mode are explained below.

Under the temperature tracking mode, during the coarse tuning period, the system or the method according to the present invention closes the switch SW1 and the switch SW2, and opens the switch SW3 and the switch SW4. Since the switch SW 1 is closed and the switch SW4 is opened, the first analog tuning input port of the VCO 40 receives the first control signal from the DAC 60, and is driven by the DAC 60 to a voltage that is predetermined to be a good choice for linear Kv for the specific VCO architecture. Since the switch SW2 is closed and the switch SW3 is opened, the second analog tuning input port of the VCO 40 receives the second control signal from the preload voltage generator circuit 80, and is driven to a voltage that is proportional to temperature and channel frequency. The preload voltage generator circuit 80 chooses one of four VPTAT curves, as shown in the FIG. 7, depending on a selected channel frequency from the PLL 50. The preload voltage generator circuit 80 will choose a curve with a larger range if the selected channel frequency has a lower channel frequency; and the preload voltage generator circuit 80 will choose a curve with a smaller range if the selected channel frequency has a higher channel frequency. Once coarse tuning is complete, the PLL then transitions to the fine lock.

Under the temperature tracking mode, during the fine lock period, the system or the method according to the present invention opens the switch SW1 and the switch SW2, and closes the switch SW3 and the switch SW4. Since the switch SW1 is opened and the switch SW4 is closed, the first analog tuning input port of the VCO 40 receives the main VCO control voltage from the loop filter 30, and is driven by the loop filter 30, and is also now driven by the closed loop PLL. Since the switch SW2 is opened and the switch SW3 is closed, the second analog tuning input port of the VCO 40 receives the third control signal from the differential amplifier 70, and is driven by the differential amplifier 70. The negative input port of the differential amplifier 70 is set to match the output voltage of the DAC 60, and the positive input port of the differential amplifier 70 is coupled to the loop filter 30 for receiving the VCO control voltage. Any slow frequency transient in the VCO will be sensed by the differential amplifier 70, and will drive the second analog tuning input port such that the first analog tuning input port and the voltage at the negative input port of the differential amplifier 70 are the same. For example, if a temperature transient causes the VCO frequency to decrease, the PLL will push the main VCO control voltage higher to keep the PLL locked at the same frequency. The amplifier will then sense this difference and drive the second fine tuning varactor higher increasing the frequency of the VCO. This will cause the PLL to react and reduce the main VCO control voltage to a nominal value. The criteria for stability is that the bandwidth of the differential amplifier loop must be at least 10 times less than the PLL loop bandwidth to guarantee that it doesn't interfere with the PLL main loop stability. This invention allows the PLL to remain locked during a −40° C. to 125° C. temperature transient while maintaining a relatively low VCO voltage gain (Kv) for the main loop. This low Kv is necessary for good phase noise performance.

Under the non-temperature tracking mode, during the coarse tuning period, the system or the method according to the present invention closes the switch SW1 and the switch SW2, and opens the switch SW3 and the switch SW4. Since the switch SW 1 is closed and the switch SW4 is opened, the first analog tuning input port of the VCO 40 receives the first control signal from the DAC 60, and is driven by the DAC 60 to a voltage that is predetermined to be a good choice for linear Kv for the specific VCO architecture. Since the switch SW2 is closed and the switch SW3 is opened, the second analog tuning input port of the VCO 40 receives the second control signal from the preload voltage generator circuit 80. Since it is under the non-temperature tracking mode, instead of a voltage which is proportional to temperature and channel frequency, the preload voltage generator circuit 80 now receives a bandgap voltage from the bandgap circuit 100, and provides a programmable bandgap reference voltage, as the second control signal, to the second analog tuning input port, and the programmable bandgap reference voltage is independent of temperature. If the programmable bandgap reference voltage is a low voltage, it would put the varactor on high capacitance. If the programmable bandgap reference voltage is a high voltage, it would put the varactor on low capacitance. This programmable bandgap reference voltage is chosen based on the selected channel frequency; such that it extends the VCO tuning range without tracking the temperature. Once coarse tuning is complete, the PLL then transitions to the fine lock.

Under the non-temperature tracking mode, during the fine lock mode, the system or the method according to the present invention opens the switch SW1 and closes the switch SW4, and maintains the switch SW2 and the switch SW3 unchanged from their previous state, which are closed and opened respectively. Since the switch SW1 is opened and the switch SW4 is closed, the first analog tuning input port of the VCO 40 receives the main VCO control voltage from the loop filter 30, and is driven by the loop filter 30, and is also now driven by the closed loop PLL. Since the switch SW2 is closed and the switch SW3 is opened, the second analog tuning input port of the VCO 40 continuously receives the second control signal from the preload voltage generator circuit 80.

While the invention has been described in terms of what is presently considered to be the most practical and preferred embodiments, it should be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:
1. A method for locking a phase lock loop (PLL) frequency by compensating a voltage controlled oscillator (VCO) control voltage, comprising:
providing a VCO with a first analog tuning input port and a second analog tuning input port;
providing a first digital-analog converter (DAC) coupled to said first analog tuning input port via a first switch;
generating a first control signal by said first DAC;
providing said first control signal to said first analog tuning input port;
providing a preload voltage generator circuit coupled to said second analog tuning input port via a second switch;
generating a second control signal from selecting a coarse band by said preload voltage generator circuit based on a selected channel frequency;
providing said second control signal to said second analog tuning input port;
providing a differential amplifier coupled to said second analog tuning input port via a third switch;
providing a processing circuit coupled to said first analog tuning input port via a fourth switch, and further coupled to said differential amplifier;

generating said VCO control voltage by said processing circuit according to a VCO output signal of said VCO and a first reference signal;

providing said VCO control voltage to said first analog tuning input port;

generating a third control signal from comparing said VCO control voltage to a second reference signal by said differential amplifier; and providing said third control signal to said second analog tuning input port.

2. The method of claim 1, wherein locking the PLL frequency comprises a coarse tuning (CT) time frame and a fine lock (FL) time frame, said FL time frame is after said CT time frame, the method further comprising:

providing said first control signal to said first analog tuning input port by closing said first switch during said CT time frame;

providing said second control signal to said second analog tuning input port by closing said second switch during said CT time frame;

prohibiting said third control signal from said second analog tuning input port by opening said third switch during said CT time frame;

prohibiting said VCO control voltage from said first analog tuning input port by opening said fourth switch during said CT time frame;

prohibiting said first control signal from said first analog tuning input port by opening said first switch during said FL time frame;

prohibiting said second control signal from said second analog tuning input port by opening said second switch during said FL time frame;

providing said third control signal to said second analog tuning input port by closing said third switch during said FL time frame; and providing said VCO control voltage to said first analog tuning input port by closing said fourth switch during said FL time frame.

3. The method of claim 1, wherein locking the PLL frequency comprises a coarse tuning (CT) time frame and a fine lock (FL) time frame, said FL time frame is after said CT time frame, the method further comprising:

providing said first control signal to said first analog tuning input port by closing said first switch during said CT time frame;

providing said second control signal to said second analog tuning input port by closing said second switch during said CT time frame;

prohibiting said third control signal from said second analog tuning input port by opening said third switch during said CT time frame;

prohibiting said VCO control voltage from said first analog tuning input port by opening said fourth switch during said CT time frame;

prohibiting said first control signal from said first analog tuning input port by opening said first switch during said FL time frame;

providing said second control signal to said second analog tuning input port by closing said second switch during said FL time frame;

prohibiting said third control signal from said second analog tuning input port by opening said third switch during said FL time frame; and providing said VCO control voltage to said first analog tuning input port by closing said fourth switch during said FL time frame.

4. The method of claim 1, further comprising:

minimizing a frequency range with preloading said second analog tuning input port by said preload voltage generator circuit.

5. The method of claim 1, wherein said VCO is a ring VCO or a LC VCO.

6. The method of claim 1, further comprising:

setting said second reference to be equal to said first control signal or to a programmable bandgap voltage reference.

7. The method of claim 1, wherein said processing circuit includes a low pass filter or a second digital-analog converter.

8. The method of claim 1, wherein said preload voltage generator circuit is a voltage proportional-to-absolute-temperature (VPTAT) preload voltage generator circuit or a voltage bandgap (VBG) preload voltage generator circuit.

9. The method of claim 8, further comprising:

providing a bandgap voltage by a bandgap circuit to said VBG preload voltage generator circuit; and setting said second reference to be equal to said bandgap voltage.

10. The method of claim 1, wherein said differential amplifier comprises a positive input port and a negative input port, said positive input port receiving said VCO control voltage, and said negative input port receiving said second reference signal.

11. A VCO compensation system for locking a PLL frequency by compensating a VCO control voltage, comprising:

a VCO with a first analog tuning input port and a second analog tuning input port;

a first digital-analog converter (DAC), coupled to said first analog tuning input port via a first switch, for providing a first control signal to said first analog tuning input port;

a preload voltage generator circuit, coupled to said second analog tuning input port via a second switch, for generating a second control signal from selecting a coarse band based on a selected channel frequency and for providing said second control signal to said second analog tuning input port;

a differential amplifier, coupled to said second analog tuning input port via a third switch, for generating a third control signal; and a processing circuit, coupled to said first analog tuning input port via a fourth switch, and further coupled to said differential amplifier, for generating said VCO control voltage by comparing a VCO output signal of said VCO to a first reference signal, and providing said VCO control voltage to said differential amplifier and said VCO;

wherein said differential amplifier generates said third control signal by comparing said VCO control voltage to a second reference, and compensates said VCO control voltage by providing said third control signal to said second analog tuning input port.

12. The VCO compensation system of claim 11, wherein locking the PLL frequency comprises a coarse tuning (CT) time frame and a fine lock (FL) time frame, said FL time frame is after said CT time frame and said first switch is closed to provide said first control signal to said first analog tuning input port during said CT time frame;

said second switch is closed to provide said second control signal to said second analog tuning input port during said CT time frame;

said third switch is opened to prohibit said third control signal from said second analog tuning input port during said CT time frame;

said fourth switch is opened to prohibit said VCO control voltage from said first analog tuning input port during said CT time frame;

said first switch is opened to prohibit said first control signal from said first analog tuning input port during said FL time frame;

said second switch is opened to prohibit said second control signal from said second analog tuning input port during said FL time frame;

said third switch is closed to provide said third control signal to said second analog tuning input port during said FL time frame; and said fourth switch is closed to provide said VCO control voltage to said first analog tuning input port during said FL time frame.

13. The VCO compensation system of claim 11, wherein locking the PLL frequency comprises a coarse tuning (CT) time frame and a fine lock (FL) time frame, said FL time frame is after said CT time frame and said first switch is closed to provide said first control signal to said first analog tuning input port during said CT time frame;

said second switch is closed to provide said second control signal to said second analog tuning input port during said CT time frame;

said third switch is opened to prohibit said third control signal from said second analog tuning input port during said CT time frame;

said fourth switch is opened to prohibit said VCO control voltage from said first analog tuning input port during said CT time frame;

said first switch is opened to prohibit said first control signal from said first analog tuning input port during said FL time frame;

said second switch is closed to provide said second control signal to said second analog tuning input port during said FL time frame;

said third switch is opened to prohibit said third control signal from said second analog tuning input port during said FL time frame; and said fourth switch is closed to provide said VCO control voltage to said first analog tuning input port during said FL time frame.

14. The VCO compensation system of claim 11, wherein said preload voltage generator circuit preloads said second analog tuning input port to minimize a frequency range.

15. The VCO compensation system of claim 11, wherein said VCO is a ring VCO or a LC VCO.

16. The VCO compensation system of claim 11, wherein said second reference is equal to said first control signal or to a programmable bandgap voltage reference.

17. The VCO compensation system of claim 11, wherein said processing circuit includes a low pass filter or a second digital-analog converter.

18. The VCO compensation system of claim 11, wherein said preload voltage generator circuit is a voltage proportional-to-absolute-temperature (VPTAT) preload voltage generator circuit or a voltage bandgap (VBG) preload voltage generator circuit.

19. The VCO compensation system of claim 18, further comprising:

a bandgap circuit, coupled to said VBG preload voltage generator circuit, for providing a bandgap voltage to said VBG preload voltage generator circuit;

wherein said second reference is set to be equal to said bandgap voltage.

20. The VCO compensation system of claim 11, wherein said differential amplifier comprises a positive input port and a negative input port, said positive input port receives said VCO control voltage, and said negative input port receives said second reference signal.

* * * * *